United States Patent
Ekbote et al.

(10) Patent No.: US 7,537,988 B2
(45) Date of Patent: May 26, 2009

(54) DIFFERENTIAL OFFSET SPACER

(75) Inventors: Shashank Ekbote, Allen, TX (US); Deborah J. Riley, Murphy, TX (US); Borna Obradovic, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 10 days.

(21) Appl. No.: 11/870,241

(22) Filed: Oct. 10, 2007

(65) Prior Publication Data
US 2009/0098695 A1  Apr. 16, 2009

(51) Int. Cl.
*H01L 21/8238* (2006.01)
*H01L 21/336* (2006.01)

(52) U.S. Cl. .......... 438/199; 438/230; 438/267; 438/302; 438/303; 438/304; 438/738; 257/E21.431; 257/E21.64; 257/E21.626; 257/E21.63

(58) Field of Classification Search .......... 257/E21.431, 257/E21.64, E21.626, E21.63
See application file for complete search history.

(56) References Cited

U.S. PATENT DOCUMENTS

| | | |
|---|---|---|
| 5,460,993 A | 10/1995 | Hsu et al. |
| 6,180,469 B1 * | 1/2001 | Pramanick et al. .......... 438/299 |
| 7,109,085 B2 * | 9/2006 | Wang et al. .......... 438/279 |
| 7,354,835 B2 * | 4/2008 | Shin et al. .......... 438/300 |
| 2007/0122962 A1 | 5/2007 | Chambers et al. |

* cited by examiner

Primary Examiner—Walter L Lindsay, Jr.
Assistant Examiner—Mohsen Ahmadi
(74) Attorney, Agent, or Firm—Wade J. Brady, III; Frederick J. Telecky, Jr.

(57) ABSTRACT

A method of fabricating a CMOS integrated circuit includes the steps of providing a substrate having a semiconductor surface, forming a gate dielectric and a plurality of gate electrodes thereon in both NMOS and PMOS regions using the surface. A multi-layer offset spacer stack including a top layer and a compositionally different bottom layer is formed and the multi-layer spacer stack is etched to form offset spacers on sidewalls of the gate electrodes. The transistors designed to utilize a thinner offset spacer are covered with a first masking material, and transistors designed to utilize a thicker offset spacer are patterned and first implanted. At least a portion of the top layer is removed to leave the thinner offset spacers on sidewalls of the gate electrodes. The transistors designed to utilize the thicker offset spacer are covered with a second masking material, and the transistors designed to utilize the thinner offset spacer are patterned and second implanted. The fabrication of the integrated circuit is then completed.

20 Claims, 3 Drawing Sheets

DIFFERENTIAL OFFSET SPACER

FIELD OF INVENTION

The present invention relates generally to semiconductor processing, and more particularly to CMOS processing flows which utilize differential spacers.

BACKGROUND

In a conventional CMOS processes, the same spacer structure generally including a sidewall and optional offset spacer on the gate sidewalls is used to form all transistors in the integrated circuit. Although a single spacer structure simplifies the process flow, a conventional single spacer process does not provide flexibility with respect to the application/function for a given transistor (e.g. high voltage or speed), nor the type of transistor (e.g. PMOS or NMOS).

For example, NMOS and PMOS transistors may require different offset spacer widths for transistor performance optimization. Moreover, depending on application/function of a specific transistor in the circuit, it may provide better performance having a relatively thin or a relatively thick (wider) offset spacer. For example, regarding static random access memory (SRAM) devices, transistors used in the bit cells of the SRAM may require a thicker offset spacer compared to other transistors in the circuit to realize (i) a larger $L_{EFFECTIVE}$, (ii) reduced impact on gate (poly) edge roughness (generally referred to as Line Edge Roughness, LER), and (iii) a reduced amount of pocket dopant penetrating through bottom of the offset spacer (or through poly edge in absence of an offset spacer). Items (i)-(iii) are known to impact SRAM bit cell transistor mismatch (local variation) which can degrade SRAM bit cell stability.

Although unconventional, process flows which use a thick offset spacer to form some devices and a thin offset spacer to form other devices, referred to as differential spacer processes, are known. In such a flow, following a conventional poly gate etch similar to a conventional offset spacer flow, the type of transistor that can be optimized better with thinner/no spacer (e.g. NMOS) is patterned, and the other transistors (e.g. PMOS) are covered with a making material such as photoresist. The patterned regions are implanted, followed by ashing the photoresist and cleaning. A thin layer of oxide is then generally formed or deposited and the required thickness of nitride offset spacer is deposited. Plasma etching of the nitride offset spacer layer is used to form the offset spacer structure for type of transistor that can be optimized better with thicker offset spacer (e.g. PMOS). The patterned regions are implanted followed by ashing the photoresist and cleaning. The conventional sequence of damage anneal, followed by source/drain (S/D) spacer deposition/patterning/implants, and other conventional steps are used to complete the formation of the integrated circuit.

Such a differential spacer process requires an additional oxide (buffer) layer be formed prior to depositing the nitride spacer layer to reduce the chance that the plasma nitride offset spacer etches doped silicon for other transistor type. Non-uniformity in underlying/remaining oxide thickness can cause significant variability in transistors formed post offset spacer etch. Moreover, such a differential spacer flow requires a deeper medium doped drain (MDD) extension implant to ensure that a significant portion of the MDD implant dose gets into the silicon and does not instead end up in the buffer oxide layer.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

In one embodiment of the invention, a method of fabricating a CMOS integrated circuit includes the steps of providing a substrate having a semiconductor surface, forming a gate dielectric and a plurality of gate electrodes thereon in both NMOS and PMOS regions using the surface. A multi-layer offset spacer stack comprising a top layer and a compositionally different bottom layer is formed and the multi-layer spacer stack is etched to leave offset spacers on sidewalls of the gate electrodes. The transistors designed to utilize a thinner offset spacer are covered with a first masking material, and transistors designed to utilize a thicker offset spacer are patterned and first implanted. At least a portion of the top layer is then removed to leave the thinner offset spacers on sidewalls of the gate electrodes. The transistors designed to utilize the thicker offset spacer are covered with a second masking material, and the transistors designed to utilize the thinner offset spacer are patterned and second implanted. The fabrication of the integrated circuit is then completed. In one embodiment of the invention both the transistors designed to utilize the thinner offset spacer and transistors designed to utilize the thicker offset spacer include transistors in the NMOS regions and PMOS regions.

The top layer can comprise silicon nitride or silicon oxynitride. The bottom layer can comprise silicon dioxide, such as polysilicon oxide. The top layer can comprise a nitride that is a non-BTBAS silicon nitride and the removing step comprises a wet etch, such as a hot phosphoric etch. The hot phosphoric etch can be used to remove all of the non-BTBAS silicon nitride.

In one embodiment of the invention an average thickness of the top layer is from 70 to 130 A, and an average thickness of the bottom layer is from 10 to 25 A. The method can further comprise the step of annealing to diffuse dopant provided by the first implanting before the removing step. The gate electrodes can comprise polysilicon.

The SRAM is one of many circuits that can benefit from the present invention. When the integrated circuit comprises an SRAM having SRAM memory regions and SRAM non-memory regions, transistors in the memory regions can receive the thicker offset spacer and transistors in the non-memory regions receive the thinner offset spacer. The cells in said SRAM memory region can comprise PMOS load transistors and NMOS driver transistors.

A method of fabricating a CMOS integrated circuit, comprising the steps of providing a substrate having a semiconductor surface, and forming a gate dielectric and a plurality of polysilicon gate electrodes thereon in both NMOS and PMOS regions and a layer of silicon dioxide thereon. A top non-BTBAS nitride layer having a thickness from 70 to 130 A is deposited on the silicon dioxide layer to form a multi-layer offset spacer stack, and the multi-layer spacer stack is etched to leave offset spacers on sidewalls of the gate electrodes. Transistors designed to utilize a thinner offset spacer are covered with a first masking material, transistors designed to utilize a thicker offset spacer are patterned and first implanted. At least a portion of the top layer is removed using hot phosphoric acid to leave thin offset spacers comprising said silicon dioxide on sidewalls of the gate electrodes. Transistors designed to utilize the thicker offset spacer are covered with a second masking material, and transistors designed to utilize the thinner offset spacer are patterned and second implanted. Fabrication of the integrated circuit is then completed.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION

Figure 1A:
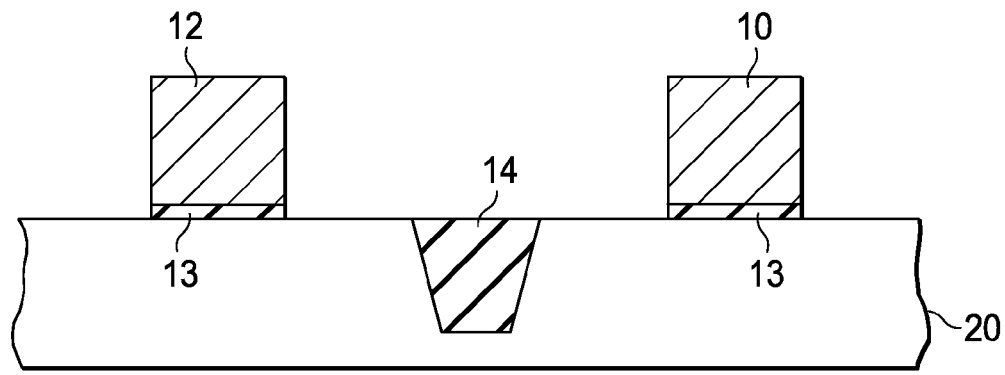
FIGS. 1A-G shows successive cross sectional views during a process sequence to implement an integrated circuit having differential offset spacers according to an embodiment of the invention.
Figure 1B:
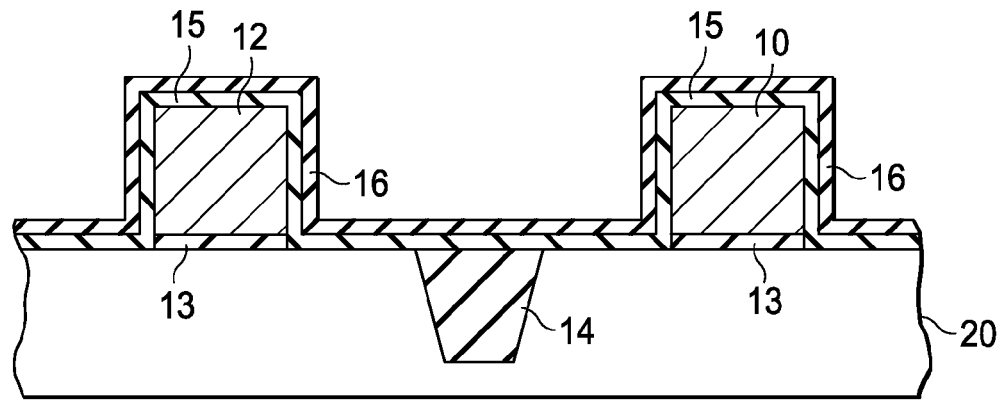

The present invention will now be described with reference to the attached drawings, wherein like reference numerals are used to refer to like elements throughout. Embodiments of the invention provide differential offset spacers which enable optimizing the offset spacer for transistors based on its application/function or location in the circuit without requiring any extra patterning/masking layers. Thus, in one embodiment of the invention, a portion of both the PMOS and NMOS transistors are processed using a thicker offset spacer and a portion of both the PMOS and NMOS transistors are processed using a thinner offset spacer. The invention is broadly applicable to CMOS integrated circuits.

FIG. 1A-G shows successive cross sectional views during a process sequence to implement an integrated circuit having differential offset spacers according to an embodiment of the invention. FIG. 1A shows defined polysilicon gates 10 and 12 formed on substrate 20 having a semiconducting (e.g. silicon) surface. The thin dielectric under gates 10 and 12 is shown as 13. Trench isolation 14 is included for isolating portions of the substrate surface for forming PMOS devices from portions for forming NMOS devices. Other isolation schemes can be used, such by using a silicon on insulator (SOI) substrate. A buffer layer 15 is then formed, such as a thermally grown poly-oxide layer or a deposited oxide layer. In one embodiment, the thickness of the buffer layer 15 is from 10 to 25 Angstroms. A top layer 16 on the buffer layer 15 is ten formed to provide a multi-layer offset spacer stack, with the resulting structure shown in FIG. 1B. The top layer 16 is compositionally different as compared to buffer layer 15. Top layer can comprise a variety of materials including silicon nitride, silicon oxynitride, or plasma enhanced silicon dioxide which is typically a polysilicon rich material compared to thermally grown or ordinary CVD oxides. In one embodiment, the top layer 16 comprises silicon nitride formed from a precursor other than bis(tertiary-butylamino) silane (BTBAS), such as using a dichlorosilane (DCS)-based process. Unlike BTBAS-based nitride layers, nitride layers formed using DCS can be etched off in hot phosphoric acid, such as in a refluxed boiling process at 150 to 180° C. It is known that silicon nitride is etched at a significantly higher rate than silicon dioxide when hot phosphoric acid ($H_3PO_4$) is used as an etchant. Other nitrides that can generally be etched in hot phosphoric include those formed using Rapid Thermal Chemical Vapor Deposition (RTCVD) and Plasma Enhanced Chemical Vapor Deposition (PECVD) processes. In one embodiment, the thickness of the top layer 16 is from 50 to 150 Angstroms, such as 70 to 130 Angstroms.

Figure 1C:
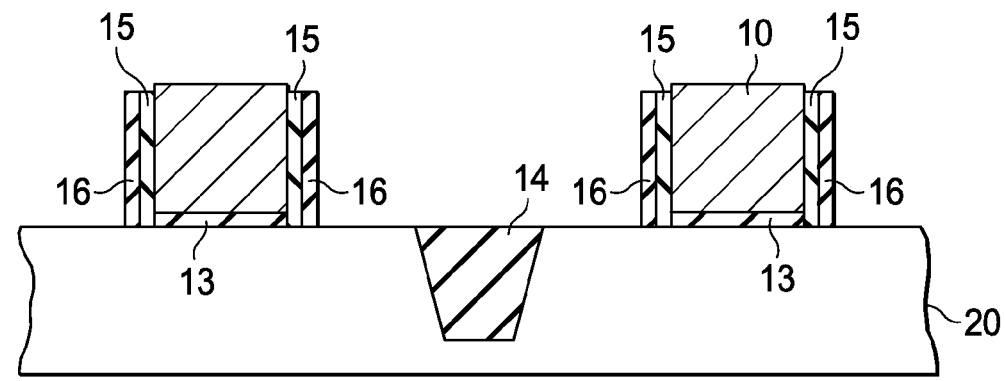

FIG. 1C shows the resulting structure after anisotropic etching of the multi-layer stack to leave what is referred to herein as thick or thicker offset spacers which comprises top layer 16 and buffer layer 15 on sidewalls of the gate electrodes 10 and 12. In contrast, as described below, thin or thinner offset spacers refer to the resulting offset spacer structures after removal of at least a portion of the top layer 16.

Figure 1D:
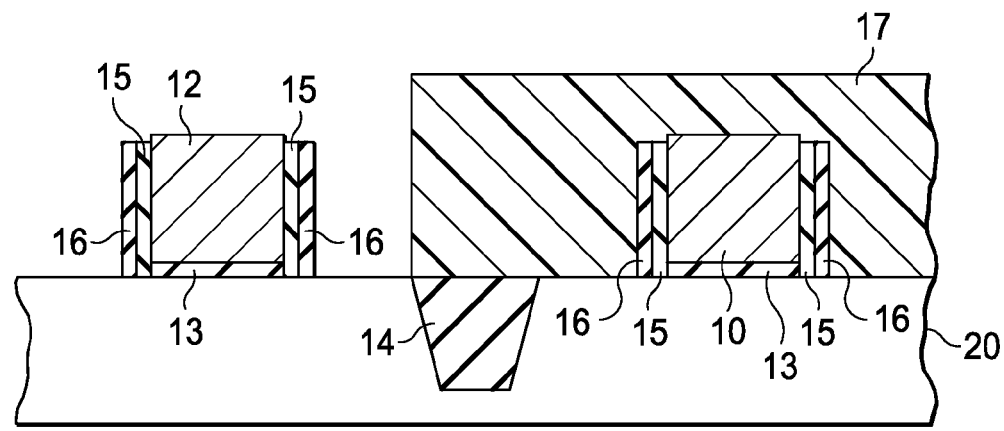

FIG. 1D shows a cross sectional view of the structure after covering transistors in the circuit designed to utilize a thin offset spacer with a first masking material 17, such as photoresist, and patterning transistors in the circuit designed to utilize the thick offset spacer. One or more implants are performed using this pattern. When the integrated circuit comprises an SRAM, transistors in the SRAM bit cells will be generally implanted at this point in the process using the thick offset spacer since thicker offset spacers can provide improved cell operation through better transistor matching (less local variation) as compared to thinner offset spacers.

Figure 1E:
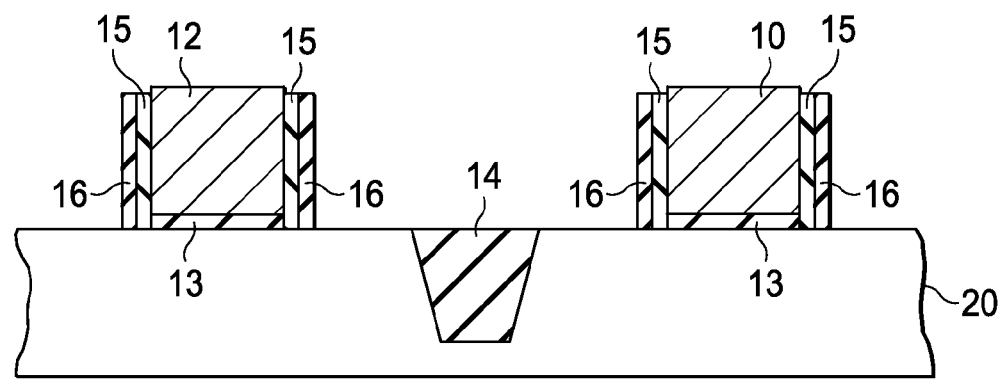

Following removal of photoresist or other masking material 17, the structure shown in FIG. 1E results. The method can also include the step of annealing to diffuse dopant provided by the implanting described above. This step is referred to as a medium doped drain (MDD) damage anneal. In one embodiment the anneal comprises a 900 to 1000° C. RTA anneal, such as a 950° C. RTA anneal for a few seconds. The anneal step diffuses the dopant into the semiconductor surface and reduces the amount of dopant that remains in the offset spacer stack, such as in buffer layer 15.

Figure 1F:
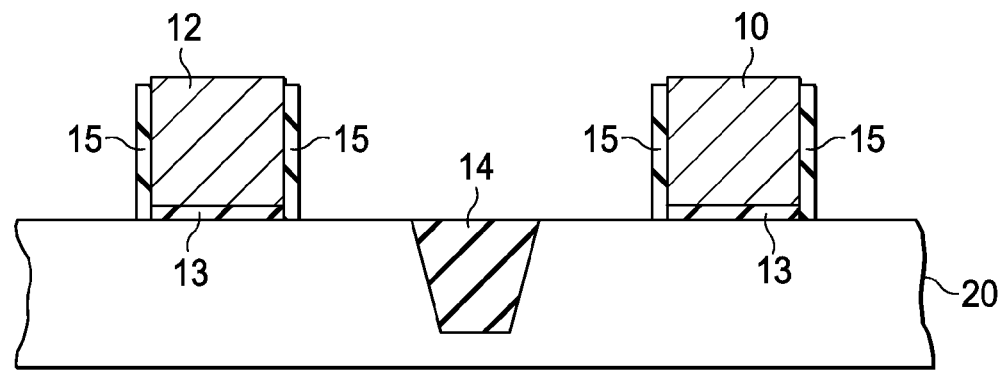

At least a portion of the top layer 16 is then removed to leave thin offset spacers. FIG. 1F shows top layer 16 completely removed with the offset spacer comprising only buffer layer 15 on sidewalls of the gate electrodes 10 and 12. In one embodiment, top layer 16 comprises a nitride formed using a non-BTBAS precursor, such as DCS, and the removing step comprises a wet etch, such as hot phosphoric acid, which allows the highly selective (e.g. relative to silicon dioxide) removal of the entire nitride layer 16 without significantly etching the buffer layer 15. However, plasma etching can also be used to remove certain top layers 16. In one embodiment plasma etching is used where the top layer 16 comprises plasma enhanced silicon dioxide, while buffer layer 15 comprises poly-oxide or other non-silicon rich silicon dioxide, such as thermally grown oxide.

Figure 1G:
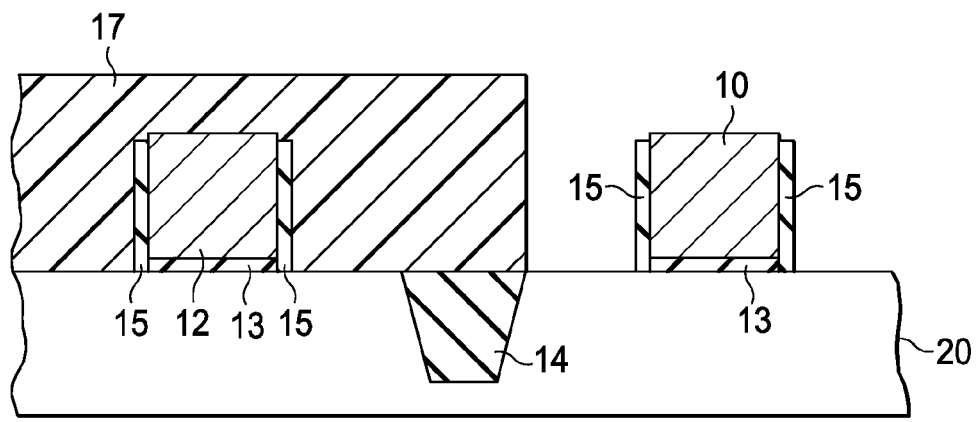

FIG. 1G shows a cross sectional view of the structure after covering the transistors designed to utilize the thick offset spacer with a second masking material (e.g. photoresist), and patterning and implanting the transistors designed to utilize the thinner offset spacer. In the SRAM example, the transistors designed to utilize the thin offset spacer can comprise non-memory circuitry, such as sense amplifiers, and the wordline (WL) and bitline (BL) drivers. For example, typical implant species for NMOS transistors using the thinner offset spacer are Arsenic for forming the S/D extension and Boron or Indium for setting the Vt of the transistor. Regarding exemplary parameters, an Arsenic dose for the extension can be from $6 \times 10^4$ $cm^{-2}$ to $1.5 \times 10^{15}$ $cm^{-2}$ in an energy range from 1 to 3 keV. In the case of Boron for setting the Vt, a dose from $3 \times 10^{13}$ $cm^2$ to $8 \times 10^{13}$ $cm^{-2}$ can be used depending on application and Vt requirement in an energy range from about 5 keV to 12 keV (energy generally depending on the poly thickness). Following removal of the masking material, the process generally includes conventional remaining FEOL steps including source/drain processing, then the BEOL steps to complete the integrated circuit.

Figure 2:
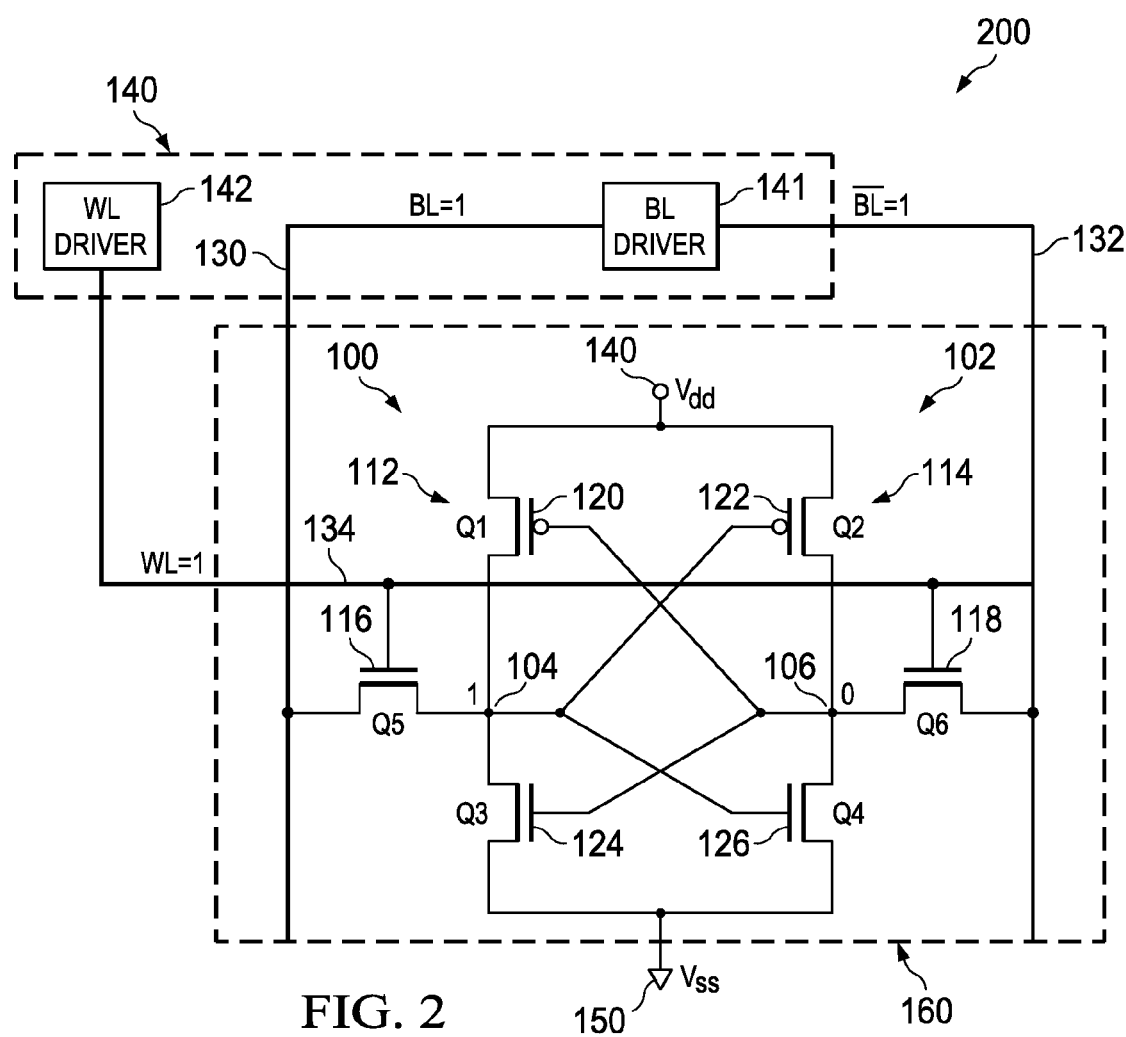
FIG. 2 is a schematic diagram of an integrated circuit comprising an SRAM having a differential 6T static random access memory (SRAM) cell and WL and BL drivers formed using a differential offset spacer process, according to an embodiment of the invention.

FIG. 2 is a schematic of an integrated circuit 200 including a differential SRAM 6T cell 100 formed in a portion of the circuit 160 where thick offset spacers were used, and non-memory portions of the circuit formed in another circuit portion 140, including the BL driver 141 and WL driver 142 where thin offset spacers are used. Bit cells 100 as illustrated, comprise a data storage cell or latch 102, generally including a pair of cross-coupled inverters, for example, inverter 112, and inverter 114, the latch 102 operable to store a data bit state. FIG. 2 illustrates that the bit is stored in the latch 102 at the data nodes or first and second latch nodes 104 and 106, respectively, having a high or "1" state and a low or "0" state, respectively. Cell 100 also comprises a pair of wordline pass transistors 116, 118 to read and write the data bit between the cross-coupled inverters 112, 114 and bit lines BL 130, BL-bar 132, when enabled by wordline 134.

Respective inverters 112, 114 comprise a p-type MOS (PMOS) pull-up or load transistor Q1 120, Q2 122 and an n-type (NMOS) pull-down transistor Q3 124, Q4 126. Pass gates (e.g., transistors) Q5 116, Q6 118 are n-channel as well, which generally supply higher conductance as compared to p-channel transistors. Pass transistors 116, 118 are enabled by wordline 134 and accessed by bit lines 130, 132 to set or reset the SRAM latch 100. Inverters 112, 114 of the SRAM memory cell 100 are connected together to a Vdd drain power supply line 140 and a Vss source power supply line 150.

In general, SRAM cells are more stable and have better data retention where the respective PMOS (120, 122) and NMOS (124, 126) transistors are balanced and matched within the two inverters (112, 114). However, as dimensions are reduced to scale down devices, it becomes increasingly difficult to achieve a balance in the relative strengths (e.g. drive current capability) of the pass gate, drive, and load transistors over the desired range of temperature, bias conditions, and process variations, as well as achieving matched transistor characteristics. As a result, SRAM cells formed as such can be adversely affected by varying operating characteristics and may be unstable and may not be able to retain the desired bit state, during either or both the read or write operations.

Significantly, embodiments of the invention provide differential offset spacers which enable optimizing the offset spacer for transistors based on its application without requiring any extra patterning/masking layers. Use of thicker offset spacers in circuit portion 160 where cells 100 are formed can improve transistor matching and thus balance of the SRAM cell and result in improved device stability. Use of thin offset spacers in circuit portion 140 where non-memory portions of circuit 100 are formed can improve PMOS devices in circuit portion 140, such as PMOS Cgd0 (gate-to drain overlap capacitance) and Ion performance.

Although a specific SRAM cell has been described in accordance with the a method according to the invention, the invention can use other cell designs and transistor technology variations, including array, bit line, or wordline orientation variations are all contemplated in the context of the present invention. Moreover, as noted above, the invention is not limited to SRAMs since the invention is generally applicable to any CMOS circuit.

The invention is also not limited to the use of silicon wafers, and may be implemented in association with the manufacture of various semiconductor devices, SRAM memory devices, or other such devices, wherein the design and optimization of an SRAM cell is an issue, where cell access is to be limited only to the memory area being used, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of fabricating a CMOS integrated circuit, comprising the steps of:

provided a substrate having a semiconductor surface;

forming a gate dielectric and a plurality of gate electrodes thereon in both NMOS and PMOS regions using said surface;

forming a multi-layer offset spacer stack comprising a top layer and a compositionally different bottom layer;

etching said multi-layer spacer stack to leave offset spacers on sidewalls of said gate electrodes;

covering transistors designed to utilize a thinner offset spacer with a first masking material;

patterning transistors designed to utilize a thicker offset spacer;

first implanting said transistors designed to utilize a thicker offset spacer;

removing at least a portion of said top layer to leave said thinner offset spacers on said sidewalls of said gate electrodes;

covering said transistors designed to utilize said thicker offset spacer with a second masking material, patterning said transistors designed to utilize said thinner offset spacer;

second implanting said transistors designed to utilize said thinner offset spacer, and completing fabrication of said integrated circuit.

2. The method of claim 1, wherein both said transistors designed to utilize said thinner offset spacer and said transistors designed to utilize said thicker offset spacer include transistors in said NMOS region and said PMOS region.

3. The method of claim 1, wherein said top layer comprises silicon nitride or silicon oxynitride.

4. The method of claim 1, wherein said bottom layer comprises silicon dioxide.

5. The method of claim 4, wherein said layer of silicon dioxide comprises polysilicon oxide.

6. The method of claim 1, wherein said top layer comprises a non-BTBAS silicon nitride and said removing step comprises a wet etch.

7. The method of claim 6, wherein said wet etch comprises hot phosphoric etching.

8. The method of claim 7, wherein said hot phosphoric etching removes all of said non-BTBAS silicon nitride.

9. The method of claim 1, wherein an average thickness of said top layer is from 70 to 130 A, and an average thickness of said bottom layer is from 10 to 25 A.

10. The method of claim 1, further comprising the step of annealing to diffuse dopant provided by said first implanting before said removing step.

11. The method of claim 1, wherein said gate electrodes comprise polysilicon.

12. The method of claim 1, wherein said integrated circuit comprises an SRAM having SRAM memory regions and SRAM non-memory regions, wherein transistors in said memory regions receive said thicker offset spacer and transistors in said non-memory regions receive said thinner offset spacer.

13. The method of claim 12, wherein cells in said SRAM memory region comprise PMOS load transistors and NMOS driver transistors.

14. A method of fabricating a CMOS integrated circuit, comprising the steps of:
 providing a substrate having a semiconductor surface;
 forming a gate dielectric and a plurality of polysilicon gate electrodes thereon in both NMOS and PMOS regions and a layer of silicon dioxide thereon;
 depositing a top non-BTBAS nitride layer having a thickness from 70 to 130 A on said silicon dioxide layer to form a multi-layer offset spacer stack;
 etching said multi-layer spacer stack to leave offset spacers on sidewalls of said gate electrodes;
 covering transistors designed to utilize a thinner offset spacer with a first masking material;
 patterning transistors designed to utilize a thicker offset spacer;
 first implanting said transistors designed to utilize a thicker offset spacer;
 removing at least a portion of said top layer using hot phosphoric acid to leave said thinner offset spacers comprising said silicon dioxide on sidewalls of said gate electrodes;
 covering said transistors designed to utilize said thicker offset spacer with a second masking material;
 patterning said transistors designed to utilize said thinner offset spacer;
 second implanting said transistors designed to utilize said thinner offset spacer, and
 completing fabrication of said integrated circuit.

15. The method of claim 14, wherein said layer of silicon dioxide comprises a polysilicon oxide layer.

16. The method of claim 15, wherein an average thickness of said polysilicon oxide layer is from 10 to 25 A.

17. The method of claim 14, further comprising the step of annealing to diffuse dopant provided by said first implanting before said removing step.

18. The method of claim 14, wherein said hot phosphoric acid removes all of said non-BTBAS silicon nitride.

19. The method of claim 14, wherein said integrated circuit comprises an SRAM having SRAM memory regions and SRAM non-memory regions, wherein transistors in said memory regions receive said thicker offset spacer and transistors in said non-memory regions receive said thinner offset spacer.

20. The method of claim 19, wherein cells in said SRAM memory region comprise PMOS load transistors and NMOS driver transistors.

* * * * *